US012619166B2

(12) United States Patent
Poiesz et al.

(10) Patent No.: US 12,619,166 B2
(45) Date of Patent: May 5, 2026

(54) CLAMP FOR HOLDING AN OBJECT AND METHOD

(71) Applicant: ASML Netherlands B.V., Veldhoven (NL)

(72) Inventors: Thomas Poiesz, Veldhoven (NL); René Adrianus Van Rooij, Eindhoven (NL); Alexander Stein, Berlin (DE)

(73) Assignee: ASML Netherlands B.V., Veldhoven (NL)

( * ) Notice: Subject to any disclaimer, the term of this patent is extended or adjusted under 35 U.S.C. 154(b) by 73 days.

(21) Appl. No.: 18/696,657

(22) PCT Filed: Oct. 14, 2022

(86) PCT No.: PCT/EP2022/078749
§ 371 (c)(1),
(2) Date: Mar. 28, 2024

(87) PCT Pub. No.: WO2023/072640
PCT Pub. Date: May 4, 2023

(65) Prior Publication Data
US 2024/0385536 A1 Nov. 21, 2024

(30) Foreign Application Priority Data
Oct. 29, 2021 (EP) .................................... 21205594

(51) Int. Cl.
*G03F 7/00* (2006.01)
*G03F 7/16* (2006.01)
*H01L 21/683* (2006.01)

(52) U.S. Cl.
CPC .......... *G03F 7/70708* (2013.01); *G03F 7/161* (2013.01); *G03F 7/7095* (2013.01); *H01L 21/6833* (2013.01)

(58) Field of Classification Search
CPC ...... G03F 7/161; G03F 7/707; G03F 7/70708; G03F 7/70733; G03F 7/7095;
(Continued)

(56) References Cited

U.S. PATENT DOCUMENTS 9,164,372 B2    10/2015  Fujimura et al.
2012/0219886 A1   8/2012  Fujimura et al.
(Continued)

FOREIGN PATENT DOCUMENTS

KR      101586426 B1    2/2016
TW      201904013 A     1/2019
(Continued)

OTHER PUBLICATIONS

Klaus Eisner, European International Searching Authority, International Search Report and Written Opinion, counterpart PCT Application No. PCT/EP2022/078749, mailed Feb. 7, 2023, 10 total pages.

*Primary Examiner* — Peter B Kim
(74) *Attorney, Agent, or Firm* — DiBerardino McGovern IP Group LLC

(57) ABSTRACT

The disclosure provides a clamp comprising a dielectric member; a conductive element disposed on the dielectric member and comprised of a first conductive material; and a number of burls arranged on the conductive element for supporting the object, each burl comprising a second conductive material, wherein the clamp comprises a stack of alternating layers of etch resistant material and a third conductive material arranged between the conductive element and the number of burls.

21 Claims, 4 Drawing Sheets

(58) Field of Classification Search
CPC ............. G03F 7/70975; H01L 21/6831; H01L
21/6833; H01L 21/6875; H01L 21/68757
See application file for complete search history.

(56)                          References Cited

U.S. PATENT DOCUMENTS

| | | | |
|---|---|---|---|
| 2015/0124234 A1* | 5/2015 | Lafarre | ............... H01L 21/6831 |
| | | | 355/72 |
| 2017/0170233 A1 | 6/2017 | Tsai et al. | |
| 2017/0312826 A1* | 11/2017 | Lafarre | ................... B05D 5/00 |
| 2018/0191322 A1 | 7/2018 | Chang et al. | |
| 2019/0224755 A1* | 7/2019 | Lafarre | ............... G03F 7/70416 |
| 2023/0105002 A1* | 4/2023 | Van De Ven | ....... H01L 21/6833 |
| | | | 355/75 |

FOREIGN PATENT DOCUMENTS

| | | |
|---|---|---|
| TW | 201914066 A | 4/2019 |
| WO | 2013113568 A2 | 8/2013 |
| WO | 2020135971 A1 | 7/2020 |
| WO | 2022106125 A1 | 5/2022 |

* cited by examiner

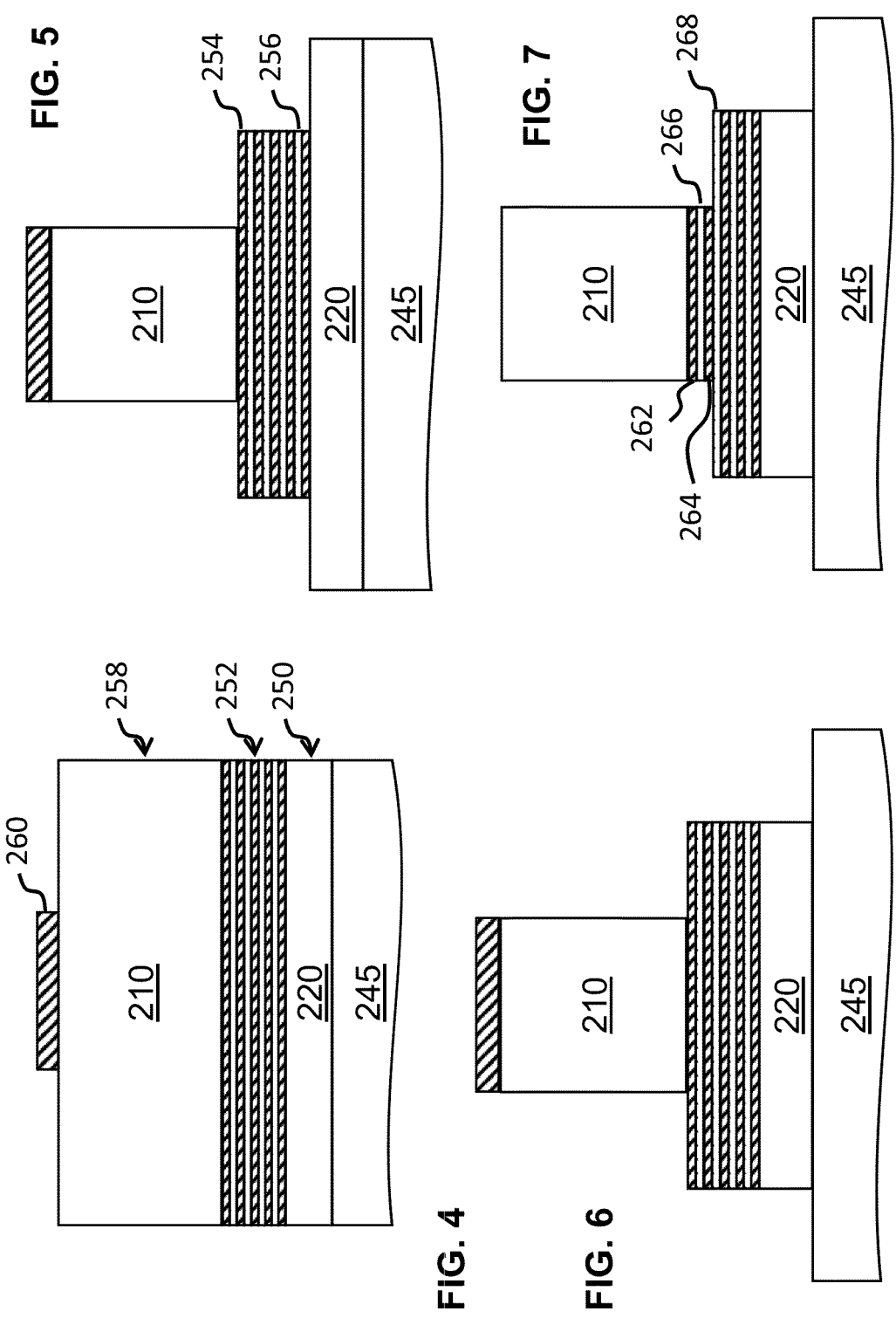

CLAMP FOR HOLDING AN OBJECT AND METHOD

CROSS-REFERENCE TO RELATED APPLICATIONS

This applications claims priority of EP application 21205594.1 which was filed on 29 Oct. 2021 and which is incorporated herein in its entirety by reference.

FIELD

The present invention relates to a clamp for holding an object and a method. The clamp may be an electrostatic clamp. The clamp is for instance part of a wafer support system. The object may be, for instance, a wafer, substrate or reticle in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features that are patterned on the substrate. Typical wavelengths currently in use are 365 nm (i-line), 248 nm (KrF), 193 nm (ArF) and 13.5 nm (EUV). A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 n.

At such short wavelengths, precise positioning of the patterning device and/or substrate within the lithographic apparatus is essential.

Such lithographic apparatuses may be provided with one or more clamps to clamp the patterning device and/or substrate to an object support, such as a mask table or a wafer table respectively. The clamp may be, for example, a mechanical clamp, a vacuum clamp, or an electrostatic clamp. Electrostatic clamps may be particularly suited to operating at EUV wavelengths, since regions of an EUV lithographic apparatus necessarily operate under near vacuum conditions. Near vacuum herein may refer to pressures in the range of 5 kPa and below, or in the range of 1 to 10 Pa.

At such short wavelengths, precise positioning of the patterning device and/or substrate within the lithographic apparatus is essential.

Such lithographic apparatuses may be provided with one or more clamps to clamp the patterning device and/or substrate to an object support, such as a mask table or a wafer table respectively. The clamp may be, for example, a mechanical clamp, a vacuum clamp, or an electrostatic clamp. Electrostatic clamps may be particularly suited to operating at EUV wavelengths, since regions of an EUV lithographic apparatus necessarily operate under near vacuum conditions.

Some electrostatic wafer clamps have a dielectric surface comprising (equally spaced) metallic lines, known in the art as 'Manhattan lines', which electrically conductively connect protrusions or 'burls' defining a plane for holding the patterning device and/or substrate.

As a result of extensive use, wherein for instance thousands or even tens of thousands of wafers are produced per day, an initial relative roughness of top surfaces of the protrusions is reduced over time. As the top surfaces smoothen, they start to stick to the wafers, which are also relatively smooth. The stickiness slows down the lithography process, and eventually involves a risk of damaging the wafers. To obviate this problem, the wafer clamp is typically refurbished at some point. Refurbishing involves etching or stripping the protrusions. The etching step removes all metallic or conductive material. Subsequently, the structures are deposited anew. This process however is relatively time intensive and costly.

It is an object of at least one embodiment of at least one aspect of the present invention to obviate or at least mitigate at least one of the above identified shortcomings of the prior art.

SUMMARY

A clamp for holding an object, the clamp comprising:
a dielectric member;
a conductive element disposed on the dielectric member and comprised of a first conductive material; and
a number of burls arranged on the conductive element for supporting the object, each burl comprising a second conductive material,
wherein the clamp comprises a stack of alternating layers of etch resistant material and a third conductive material arranged between the conductive element and the number of burls.

In an embodiment, the first, second, third conductive material are the same.

In an embodiment, the first, second and/or third conductive material comprise Chromium Nitride (CrN).

In an embodiment, the etch resistant material comprises Si.

In an embodiment, the stack has a total thickness in the order of 0.5 to 20 mm.

In an embodiment, the stack comprises at least two layers of etch resistant material.

In an embodiment, the stack comprises at least four layers of etch resistant material and at least three layers of the third conductive material.

In an embodiment, each layer of the stack has a thickness in the order of 50 nm to 1 mm.

The clamp may be an electrostatic wafer clamp.

According to another aspect, the disclosure provides a lithographic system comprising a clamp according to claim 1.

According to yet another aspect, the disclosure provides a clamp for holding an object, the clamp comprising:
a plurality of burls arranged for supporting the object, each burl comprising a first conductive material,
wherein the plurality of burls is on top of a stack of alternating layers of a layer comprising etch resistant material and a layer comprising a second conductive material, the etch resistant material has a lower removal rate than the removal rate of the first conductive material when the plurality of burls is being removed, and wherein bottom parts of the plurality of burls are formed by the stack of alternating layers.

According to yet another aspect, the disclosure provides a method of making a clamp for holding an object, the method comprising the steps of:

disposing a conductive element comprised of a first conductive material on a dielectric member;

arranging a number of burls for supporting the object on the conductive element, characterized in that each burl comprises a top part comprising a second conductive material and a bottom part comprising a stack of alternating layers of etch resistant material and a third conductive material.

The method may comprise the steps of:

removing the top part of the burls by etching;

depositing a new layer of the second conductive material on the dielectric member;

depositing a number of dots of etch resistant material on the new layer of second conductive material;

removing the second conductive material by etching; and removing the dots of etch resistant material.

BRIEF DESCRIPTION OF THE DRAWINGS

Embodiments of the invention will now be described, by way of example only, with reference to the accompanying schematic drawings, in which:

FIGS. 4 to 7 schematically depict cross sections of a burl during subsequent steps of an embodiment of a method of making a burl.

DETAILED DESCRIPTION

Figure 1:
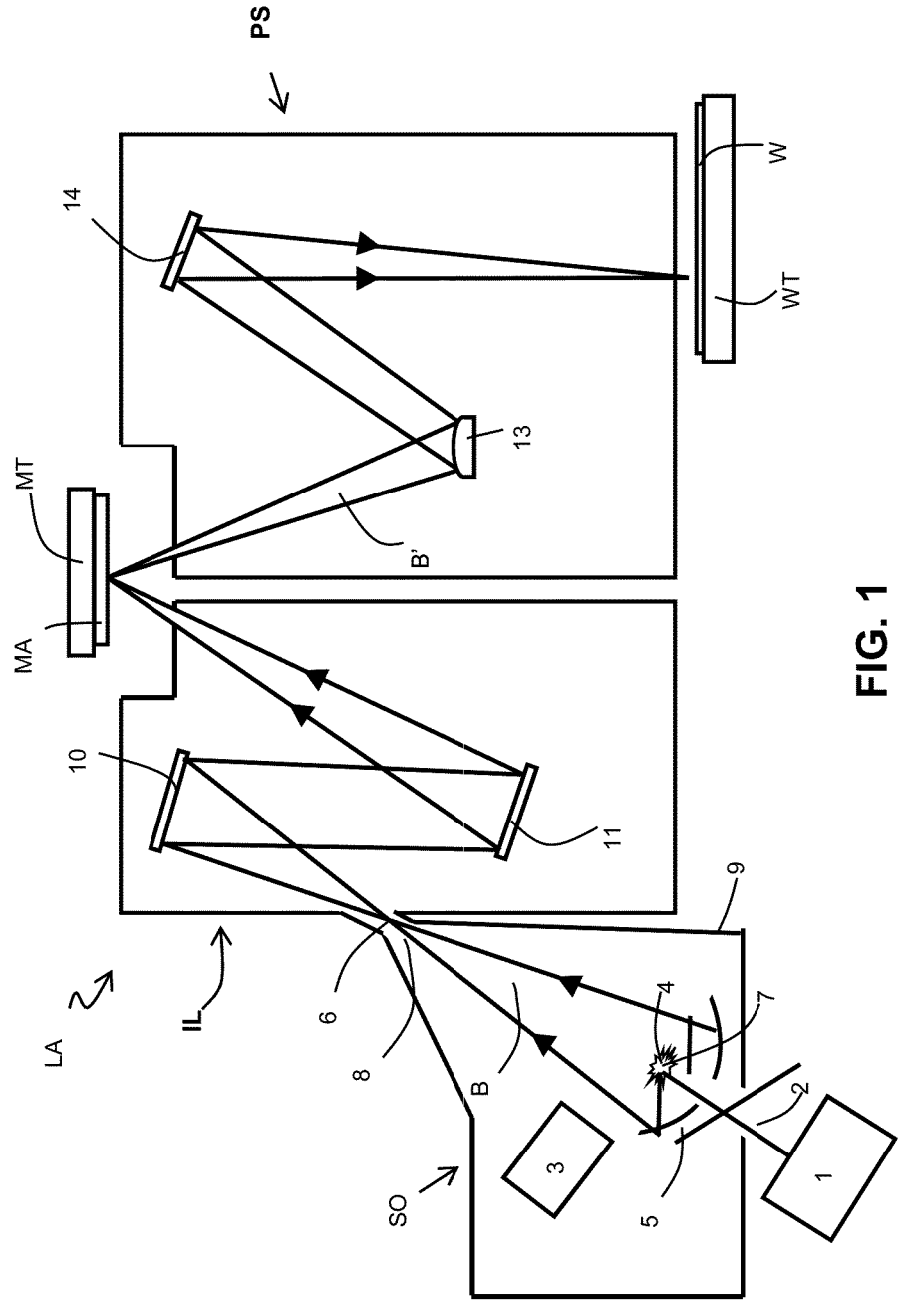
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Figure 2:
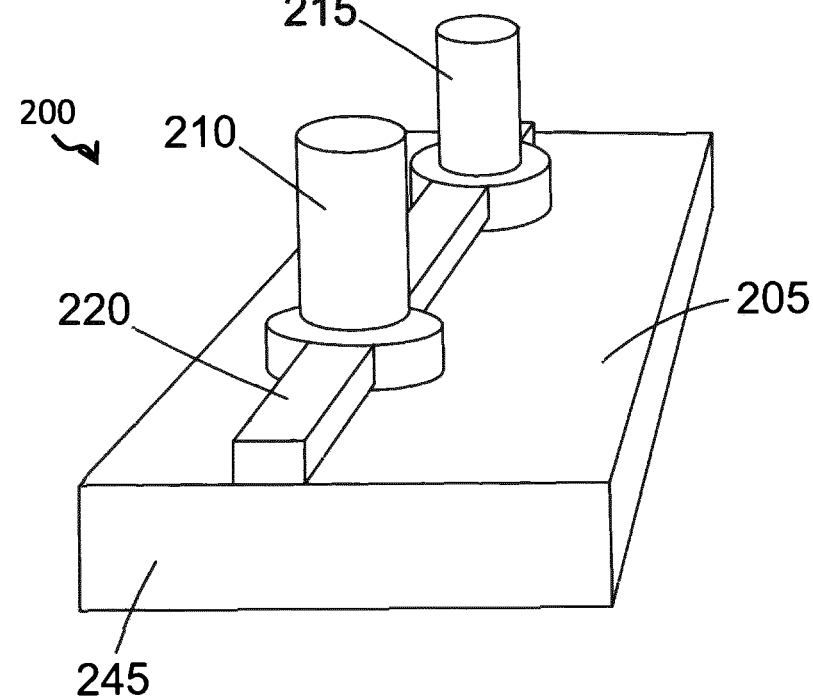
FIG. 2 depicts a perspective view of a portion of an electrostatic clamp having an plurality of conductive burls connected by a Manhattan line.

With reference to FIG. 2, the substrate table WT may comprise a clamp 200, also known as a chuck, configured to clamp the substrate W to the substrate support WT. The main body of the electrostatic clamp generally corresponds in shape and size to the substrate W. At least on an upper surface 205 of the clamp, e.g. a surface which in use faces the substrate W, the clamp 200 has projections 210, 215, also referred to as burls. The burls extend from the upper surface 205 of the clamp to define a plane in which the substrate W is held.

It will be appreciated that the term 'upper' is used in the context of the example lithographic apparatus LA of FIG. 1. Herein the electrostatic clamp 200 is depicted in a particular orientation. It will be understood that the disclosed clamp may be disposed in various orientations, and therefore the term 'upper' should be taken in the context of a particular described use case.

In an embodiment, there can be many hundreds, thousands, or tens of thousands, of burls distributed across a clamp of diameter, e.g., 200 mm, 300 mm or 450 mm. Tips of the burls generally have a small area, e.g. less than 1 mm², such that the total area of all of the burls extending from the upper surface of the electrostatic clamp 245 is less than about 10% of the total area of the total surface area of the upper surface. Because of the burl arrangement, there is a high probability that any particle that might lie on the surface of the substrate W, electrostatic clamp 200 or substrate support WT will fall between burls and will not therefore result in a deformation of the substrate or substrate holder. The burl arrangement, which may form a pattern, can be regular or can vary as desired to provide appropriate distribution of force on the substrate W and substrate support WT.

FIG. 2 depicts a perspective view of a portion of a dielectric member 245 of the electrostatic clamp 200. The dielectric member 245 has a surface 205, e.g. a surface facing the substrate W in use.

The depicted portion shows a first burl 210 and a second burl 215. Each burl 210, 215 may comprise, or be comprised of, an electrically conductive layer or coating. The burls 210, 215 are coupled to an electrically conductive element 220. The dielectric surface 205 of the electrostatic clamp 200 may comprise a plurality of such electrically conductive elements 220. The conductive elements or lines 220 may be laid out in a generally repetitive and/or regular pattern, and may be referred to as "Manhattan lines". The surface of the burls touching the object (e.g. wafer) may have the same voltage or may be grounded.

The electrically conductive element 220 may be arranged on or embedded in a dielectric surface 205 of the electrostatic clamp 200. The electrically conductive element 220 may be raised, e.g. not flush, relative to the dielectric surface 205 of the electrostatic clamp 200. Alternatively, the conductive element 220 may be embedded in the surface 205 (not shown).

Additionally or alternatively, the electrostatic clamp 200 depicted in FIG. 2 may be clamp configurable to electrostatically clamp a lithographic projection reticle or reticle blank in at least one of a lithographic projection apparatus, a reticle handling apparatus, and a reticle manufacturing apparatus.

Figure 3:
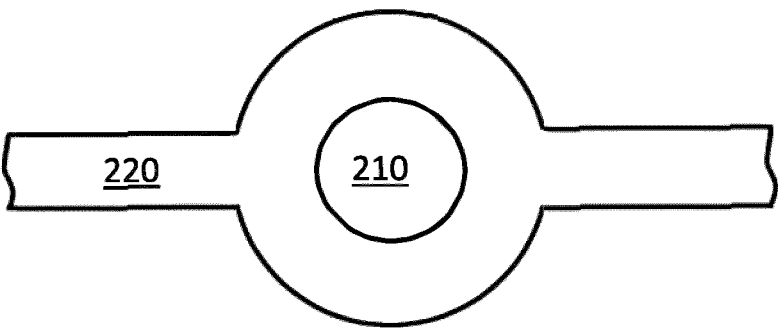
FIG. 3 depicts a top view of a burl and a Manhattan line.

Although the burls 210, 215 are depicted as cylindrical in FIGS. 2 and 3, it will be appreciated that the burls 210, 215 can have other shapes suitable for supporting an object, e.g. the substrate W or a reticle (not shown). In some embodiments, the burls 210, 215 have the same shape and dimensions throughout their height. In other embodiments, the burls 210, 215 may be tapered. The burls 210, 215 may also vary in dimensions. For example, burls in different embodiments may project a distance of from approximately 1 micrometer to approximately 5 millimeters.

Although only two burls 210, 215 are shown in FIG. 2, it will be appreciated that the electrostatic clamp 200 map comprise many more burls, such as hundreds, thousand or even tens of thousands of burls. Together, the burls define a plane for supporting an object such as the substrate W.

Furthermore, for purposes of example only, the electrically conductive element 220 is depicted as being straight, e.g. the burls 210, 25 are arranged on a linear path defined by the straight electrically conductive element 220. In an exemplary embodiment, the electrostatic clamp may comprise a plurality of straight electrically conductive elements 220 arranged in parallel or in another pattern, wherein the burls are also arranged in straight lines. In other embodiments falling within the scope of the disclosure, the electrically conductive elements 220 may have different shapes or arrangements, such as curves, circles or spirals. In some embodiments, the electrically conductive elements 220 may be arranged to radially extend from a perimeter and/or center of the dielectric surface 205.

In some embodiments, the burls may be arranged in concentric rings on the surface 205 of the dielectric member 245. A plurality of electrically conductive elements may extend between and connect each of the plurality of burls arranged in the rings.

As described above, the electrically conductive element 220 may be arranged in a trench (not shown) formed on the surface 205 of the dielectric member 245. The trench may be formed with sloping sidewalls. For example, in some embodiments an angle of the slope relative to a plane defined by the surface 205 of the dielectric member 245 may be between 30 and 40 degrees. Such sloping sidewalls may be formed by a process of wet-etching.

Referring to FIGS. 4 to 7, an embodiment of a method of making a clamp comprising at least one burl 210 according to the disclosure may comprise the following steps.

FIG. 4 shows a first step, comprising depositing a first layer 250 of a first conductive material. Said first layer 250 will eventually form the Manhattan lines 220. The method comprises depositing a second composite layer or stack 252 on top of the first layer 250. The stack 252 comprises a number of alternating layers 254, 256 of an etch stop material (layers 254) and a second conductive material (layer 256) respectively. A third layer 258 of a third conductive material is deposited on top of the stack 252. A fourth layer 260 of an etch stop material is deposited on top of the third layer 258. The layer 260 forms a mask to eventually form the one or more burls 210. The burl 210 has a thickness between 1 mm and 100 mm, preferably between 5 mm and 15 mm.

In an embodiment, the first, second and/or third conductive material may comprise Chromium Nitride (CrN), diamond-like carbon (DLC), or a similarly suitable material. The etch stop layers 254 and/or 260 may comprise Si or a similarly suitable material. In an embodiment, the deposition steps of the respective layers 250, 254, 256, 258, 260 may all take place in the same deposition chamber, wherein input of deposition material is adjusted. I.e., an input of the deposition chamber is changed from a certain conductive material to a certain etch stop material, depending on, for instance, predetermined thickness of a respective layer, deposition rate of a respective material, etc. In an embodiment, the first, second and/or third conductive material may comprise the same material.

Each layer 254, 256 of the stack 252 may have a thickness in the order of 50 nm to 1 mm, preferably between 80 nm and 300 nm. The stack 252 may have a thickness in the order of 0.2 mm to 20 mm, preferably between 0.4 mm and 1 mm. The first layer 250 may have a thickness in the order of 0.2 to 10 mm, preferably between 0.4 mm and 1 mm. The third layer 258 may have a thickness in the order of 0.5 mm to 15 mm, preferably between 5 mm and 11 mm. The stack 252 may comprises at least one or two sets of alternating layers of conductive material and etch stop material. Adding more alternating layers to the stack 252 may enable additional refurbishing steps, as explained herein below with reference to FIGS. 8 to 12. In an embodiment, the stack 252 may comprise at least four layers 256 of conductive material sandwiched between at least five layers 254 of etch stop material. The etch stop material and the conductive material may be selected such that each material can be removed selectively. Selectively herein indicates that one material may be removed (for instance by wet etching or ion beam forming) while the other material is substantially unaffected by the removal step, and vice versa. For example, when the burl 210 is partially or fully removed the etch resistant material has a lower removing rate than that of the burl 210. The removal rate of the etch resistant material is between $\frac{1}{10}$ and $\frac{1}{10000}$ of the removal rate of the first conducting material of the burl when the plurality of burls is being removed, preferably between $\frac{1}{20}$ and $\frac{1}{1000}$, more preferably between $\frac{1}{50}$ and $\frac{1}{200}$.

FIG. 5 shows the result of a second step, wherein the conductive material of the third layer 258 has been removed. The removal comprises for instance etching, ion beam forming or laser forming. The masking function of the layer 260 ensures that parts of the layer 258 covered by the mask 260 remain, forming the one or more burls 210. The layer 220 is covered by the multilayer stack 252, comprising for instance intermittent layers of Si and CrN. The conductive material of layer 250, typically CrN, under the second etch stop, next to the 'manhattan' structure 220 as designed, has to be removed as well. The multilayer etch stop, of layers 262, 264, is very etch resistant. For instance laser machining allows the full etch stop multilayer of stack 252 to be removed in locations where no coating is supposed to remain on the surface of the substrate 254, resulting in the structure shown in FIG. 5.

FIG. 6 shows a next step. Herein, sections of the first layer 250 not covered by the stack 252 including the etch stop material are removed. Removal is done by, for instance, wet etching, ion beam forming or laser forming. The top layer of etch stop material 254 functions to protect the layers of conductive material covered by said layer. The stack 252 will have roughly the same area as the layer 220 seen in a top view of the clamp. The combination of the stack 252 and the layer 220 can be patterned as the Manhattan line.

In another embodiment, the stack 252 can be deposited directly on the dielectric member 245, patterned as the Manhattan line. The layer 220 can be not present. The stack 252 can be sufficiently conductive, connecting the burls.

FIG. 7 shows a subsequent step, wherein etch stop material is removed. This step removes the layers 260 covering the burls 210 and also removes the etch stop material of layers 254 not covered by the burls 210. Removal may include wet etching or ion beam forming. As shown in FIG. 7, the removal step may remove a first layer 262 only, or a first layer 262 and a second layer 264 of etch stop material. A first conductive stack layer 266 may have been removed in the process of removing the etch stop material, with a second conductive stack layer 268 now being partly exposed. The removal step of FIG. 7 may involve, for instance, ion beam forming (IBF). Ion beam forming is not stopped by the etch stop layers 262, 264. Instead, ion beam forming will remove material down to a predetermined depth. IBF uses a relatively wide beam (much larger than a typical diameter of a burl 210) and is intended to flatten the burl top ends. The latter drives the amount of material removal. So the amount of layers 262, 264, 266 of the stack 252 affected by the IBF removal step is driven by the material removal needs of the top of the burl. When using ion beam forming, a thickness of the layer 260 is selected to be smaller than the thickness of the stack 252. Depending on a selected number of possible refurbishments, the thickness of layer 260 is, for instance, at most half, for instance about a third, or for instance at most a fourth, of the total thickness of the stack 252.

FIG. 7 shows a cross section of a burl 210 on an associated Manhattan line 220, ready for holding an object such as a wafer, mask or reticle. The at least one burl 210 shown in FIG. 7 is typically part of a clamp according to the present disclosure. The clamp itself comprises a multitude of burls as shown in FIG. 7. The layer 254 comprising etch resistant material and the layer 256 comprising a conductive material have about the same area seen from a top view of the clamp. The layer 256 approximately fully overlaps the layer 254.

As illustrated in FIG. 7, as a result of the subsequent step during which etch stop material is removed, the bottom part of the burl is formed from the stack of alternating layers 252. Comparing the stack of alternating layers 252 in FIGS. 4 and 7, part of the stack 252 which is not covered by the burl has been removed. As a result, the bottom part of the burl as shown in FIG. 7 comprises part of a stack of alternating layers, indicated in FIG. 7 by reference numbers 262, 264 and 266.

Figures 8, 9, 10, 11, 12:
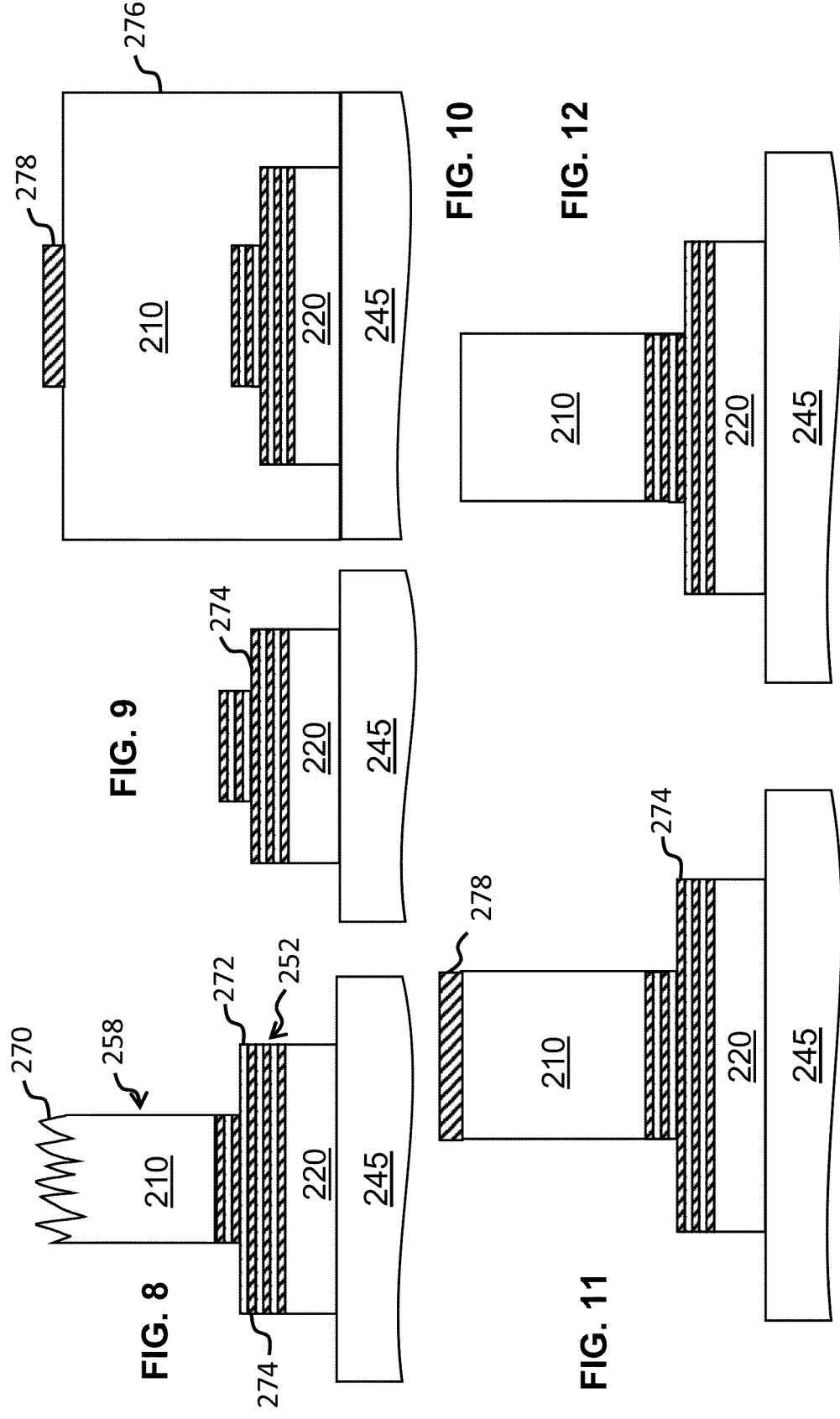
FIGS. 8 to 12 schematically depict cross sections of a burl during subsequent steps of an embodiment of a method of refurbishing a burl.

FIG. 8 shows a cross section of the burl 210 with a top surface 270 that has been damaged. The damage typically results from wear and tear resulting from use, as explained above. The top surface may for instance have become too smooth and as a result sticky. Alternatively the surface 270 may have become too rough with respect to a predetermined surface structure.

FIG. 9 shows a first step of a method to refurbish the clamp. Rather than removing the entire structure, the stack 252 including alternating layers of conductive and etch stop material, enables to only remove the top part 258. Removal may involve, for instance, wet etching to remove the conductive material of the burls 210. The etching may also remove sides of one layer 272 of conductive material, comprised in the stack 252. A subsequent layer 274 of etch stop material will stop the etching process. As a result, the stack 252 will leave the lower layer 220 of conductive material, typically CrN, protected from etching. The number of alternating sets of material in the stack 252 may determine the number of possible rework runs. For instance, two to three rework or refurbishing runs may be possible, using a stack of about nine alternating layers 254, 256.

FIG. 10 shows a subsequent step. Herein, a layer of conductive material 276 is deposited on the structure of FIG. 9. A masking layer 278, similar to the layer 260 shown in FIG. 4, is deposited on top of the layer 276. The layer 276 basically redeposits burl layer 210. The layer 278 adds a structuring mask determining the shape of the burls.

FIG. 11 shows a next step comprising removing unwanted material. Removing herein may include etching, typically wet etching. Conductive material of the layer 276 uncovered by the masking layer 278 may be removed by wet etching. The etch stop layer 274 included in the stack 252 stops the etching process to protect the Manhattan lines 220.

FIG. 12 depicts a subsequent step including removing the mask 274. Removing the mask 278 may include ion beam forming (IBF). The IBF process may also remove parts of the etch stop layer 274 exposed by the burls 210.

FIG. 12 shows a cross section of a burl 210 on an associated Manhattan line 220, ready for holding an object such as a wafer, mask or reticle. The at least one burl 210 shown in FIG. 12 is typically part of a clamp according to the present disclosure. The clamp itself comprises a multitude of burls as shown in FIG. 12. Thus, in a limited number of steps, described with respect to FIGS. 8 to 12, the clamp of the disclosure can be refurbished. The method of the disclosure obviates removing and subsequently redepositing the entire structure including the Manhattan lines 220. Refurbishing as a result provides substantial savings of time and associated costs.

As illustrated in FIGS. 8-12, the bottom part of the burl is formed from the stack of alternating layers 252. Comparing the stack of alternating layers 252 in FIGS. 8 and 12, one can see that, due to the refurbishing process, part of the stack 252 which is not covered by the burl has been removed. As a result, the stack of alternating layers 252 forming the bottom part of the burl in FIG. 12 has become thicker and now comprises additional layers compared to the burl as shown in FIG. 8.

When the burl is damaged, as shown in FIG. 8, refurbishing the burl may be needed. In conventional systems, the etch stop layer is already gone. Thus the whole burl and all conductive structures including the Manhattan lines are removed and deposited again. This costs time and effort. Instead of one etch stop layer, the clamp of the disclosure has a multilayer stack of, for instance, CrN and Si comprising layers, allowing multiple interfaces where the Si layer acts as an etch stop. As a result, after every refurb the clamp can be brought back to 'Manhattan line present' state which allows for faster and cheaper refurbishing of the clamp. Manhattan line present state herein refers to the predetermined structure of conductive lines 220, which basically remains intact during refurbishing.

In an embodiment, the bottom part 220 may be for instance about 1 μm thick. The conductive material of lines 220 can be made of CrN (electrically conductive). This part may be referred to as 'Manhattan' line. Basically, line 220 is a thin film interconnect to electrically connect all burls 210, 215 to a reference voltage, referred to as ground. A top part of the burls is, for instance, made of CrN. Each burl 210, 215 may have a height of about 9 mm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clauses

1. A method of making a clamp for holding an object, the method comprising:
   arranging a number of burls for supporting the object, each burl comprising a first conductive material,
   wherein the plurality of burls is on top of a stack of alternating layers of a layer comprising etch resistant material and a layer comprising a second conductive material, the etch resistant material has a lower removal rate than the removal rate of the first conductive material when the plurality of burls is being removed.

2. The method of clause 1, wherein the stack is arranged above a dielectric member, the method further comprising:
   removing the plurality of burls;
   depositing a layer comprising the first conductive material on the dielectric member;
   depositing a layer comprising the etch resistant material on the layer of the first conductive material;
   patterning the layer comprising the etch resistant material for forming another plurality of burls;
   removing the first conductive material by etching for forming the another plurality of burls; and removing the layer comprising the etch resistant material.

The invention claimed is:

1. A clamp for holding an object, the clamp comprising:
   a plurality of burls arranged and configured to support the object, each burl comprising a first conductive material, wherein the plurality of burls is on top of a stack of alternating layers of a layer comprising etch resistant material and a layer comprising a second conductive material, the etch resistant material has a lower removal rate than the removal rate of the first conductive material when the plurality of burls is being removed, and wherein bottom parts of the plurality of burls are formed from the stack of alternating layers.

2. The clamp of claim 1, wherein the stack is configured to connect at least two burls of the plurality of burls.

3. The clamp of claim 1, wherein the removal rate of the etch resistant material is between $\frac{1}{10}$ and $\frac{1}{10000}$ of the removal rate of the first conducting material when the plurality of burls is being removed.

4. The clamp of claim 1, further comprising a conductive element comprising a third conductive material below the stack, which conductive element is configured to conductively connect at least two burls of the plurality of burls.

5. The clamp of claim 4, wherein the etch resistant material protects the conductive element when the plurality of burls is being removed.

6. The clamp of claim 4, wherein the first, second, and third conductive materials are the same materials.

7. The clamp of claim 4, wherein the stack comprises at least four layers comprising etch resistant material and at least three layers comprising the third conductive material.

8. The clamp of claim 4, wherein the first second, and third conductive materials comprise CrN.

9. The clamp of claim 1, wherein the etch resistant material comprises Si.

10. The clamp of claim 1, wherein the stack has a total thickness between 0.2 and 20 mm.

11. The clamp of claim 1, wherein the stack comprises at least two layers of the etch resistant material.

12. The clamp of claim 1, wherein the clamp is an electrostatic wafer clamp.

13. The clamp of claim 1, wherein the layer comprising etch resistant material and the layer comprising the second conductive material have about the same area seen from a top view of the clamp.

14. A lithographic system comprising a clamp according to claim 1.

15. The clamp of claim 1, wherein each layer of the stack has a thickness between 50 nm and 1 mm.

16. The clamp of claim 1, wherein the burls define a plane configured to support the object.

17. The clamp of claim 1, wherein the stack is configured to electrically connect the burls.

18. A method of making a clamp for holding an object, the method comprising the steps of:

disposing a conductive element comprising a first conductive material on a dielectric member;

arranging a number of burls, configured to support the object, on the conductive element, wherein each burl comprises a top part comprising a second conductive material and a bottom part comprising a stack of alternating layers of etch resistant material and a third conductive material.

19. A method of making a clamp for holding an object, the method comprising:

arranging a number of burls for supporting the object, each burl comprising a first conductive material, wherein arranging the number of burls comprises:

depositing a stack of alternating layers of a layer comprising etch resistant material and a layer comprising a second conductive material on top of an electrically conductive element, depositing the first conductive material on the stack;

removing the first conductive material not covered by a mask and removing part of the stack not covered by the first conductive material to thereby form the burl from the first conductive material and a remaining part of the stack.

20. A method of refurbishing a clamp for holding an object, wherein the clamp comprises a plurality of burls, each burl comprising a first conductive material, on top of a stack of alternating layers of a layer comprising etch resistant material and a layer comprising a second conductive material, the stack is arranged above a dielectric member, the method comprising:

removing the first conductive material of each of the plurality of burls to form an intermediate structure;

depositing a layer comprising the first conductive material on the intermediate structure;

depositing a layer comprising the etch resistant material on the layer of the first conductive material;

patterning the layer comprising the etch resistant material for forming another plurality of burls; and removing the first conductive material by etching for forming the another plurality of burls; and removing the layer comprising the etch resistant material.

21. The method of claim 20, further comprising removing sides of a layer of the second conductive material of each of the plurality of burls.

\* \* \* \* \*